(12) United States Patent
Ueta et al.

(10) Patent No.: US 9,209,361 B2
(45) Date of Patent: Dec. 8, 2015

(54) NITRIDE SEMICONDUCTOR LIGHT-EMITTING ELEMENT

(71) Applicant: Panasonic Corporation, Osaka (JP)

(72) Inventors: Akio Ueta, Osaka (JP); Masaaki Yuri, Toyama (JP); Toshiya Yokogawa, Nara (JP); Ryou Kato, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/320,378

(22) Filed: Jun. 30, 2014

(65) Prior Publication Data

US 2015/0021652 A1    Jan. 22, 2015

(30) Foreign Application Priority Data

Jul. 22, 2013    (JP) .................................. 2013-151400

(51) Int. Cl.
*H01L 29/06*    (2006.01)
*H01L 31/00*    (2006.01)
(Continued)

(52) U.S. Cl.
CPC .............. *H01L 33/325* (2013.01); *H01L 33/16* (2013.01)

(58) Field of Classification Search
USPC ...................... 257/E33.012, 103, 13
See application file for complete search history.

(56) References Cited

U.S. PATENT DOCUMENTS

| 5,693,963 | A  | 12/1997 | Fujimoto et al. |
| 7,182,811 | B2 | 2/2007  | Ishida |

(Continued)

FOREIGN PATENT DOCUMENTS

| JP | 8-148718   | 6/1996 |
| JP | 2006-237539 | 9/2006 |

(Continued)

OTHER PUBLICATIONS

C. Stampfl et al "Doping of AlxGa1_xN alloys" Material science and Engineering B59, 1999, pp. 253-257.

(Continued)

*Primary Examiner* — Telly Green
(74) *Attorney, Agent, or Firm* — McDermott Will & Emery LLP

(57) ABSTRACT

The present invention improves luminous efficiency of a nitride semiconductor light-emitting element. In the nitride semiconductor light-emitting element, a non-polar or semipolar $Al_{x2}In_{y2}Ga_{z2}N$ layer having a thickness of t1 is interposed between the $Al_{x1}In_{y1}Ga_{z1}N$ layer included in the p-type nitride semiconductor layer and the active layer ($0<x2\leq1$, $0\leq y2<1$, $0<z2<1$, $x2+y2+z2=1$). The $Al_{x2}In_{y2}Ga_{z2}N$ layer has first and second interfaces located close to or in contact with the active layer and the $Al_{x1}In_{y1}Ga_{z1}N$ layer, respectively. The $Al_{x2}In_{y2}Ga_{z2}N$ layer has a hydrogen concentration distribution along its thickness direction in the inside thereof in such a manner that the hydrogen concentration is increased from the first interface to a thickness t2 (t2<t1), reaches a peak at the thickness t2, and is decreased from the thickness t2 to the second interface. Magnesium contained in the $Al_{x1}In_{y1}Ga_{z1}N$ layer is prevented from being diffused into the active layer to improve the luminous efficiency.

8 Claims, 11 Drawing Sheets

(51) Int. Cl.
*H01L 33/32* (2010.01)
*H01L 33/16* (2010.01)

(56) References Cited

U.S. PATENT DOCUMENTS

| | | | |
|---|---|---|---|
| 7,397,069 B2 | 7/2008 | Tachibana et al. | |
| 7,714,350 B2 | 5/2010 | Sugawara et al. | |
| 2008/0048194 A1* | 2/2008 | Kudo et al. | 257/94 |
| 2008/0073660 A1 | 3/2008 | Ohno et al. | |
| 2010/0127239 A1 | 5/2010 | Park et al. | |
| 2011/0220871 A1* | 9/2011 | Kamikawa et al. | 257/13 |
| 2012/0146048 A1 | 6/2012 | Kato et al. | |
| 2013/0234110 A1 | 9/2013 | Kato et al. | |

FOREIGN PATENT DOCUMENTS

| | | |
|---|---|---|
| JP | 2009-043970 | 2/2009 |
| JP | 2010-067792 | 3/2010 |
| JP | 2012-151512 | 8/2012 |
| WO | 2008/117788 | 10/2008 |
| WO | 2011/024385 | 3/2011 |
| WO | 2012/140844 | 10/2012 |

OTHER PUBLICATIONS

R. R. Wixom et al "Binding of the N interstitial with neutral MgH in p-type GaN investigated with density functional theory" Physical Review B 72, 024114, 2005.

* cited by examiner

NITRIDE SEMICONDUCTOR LIGHT-EMITTING ELEMENT

BACKGROUND

1. Technical Field

The present invention relates to a nitride semiconductor light-emitting element.

2. Description of the Related Art

Recently, a nitride semiconductor light-emitting element having a principal plane of an m-plane has been researched and developed actively to improve luminous efficiency. This is because a nitride semiconductor light-emitting element having a principal plane of an m-plane is free from piezoelectric field, which decreases luminous efficiency. Hereinafter, a nitride semiconductor light-emitting element having a principal plane of an m-plane is referred to as "m-plane nitride semiconductor light-emitting element".

United States Pre-Grant Patent Application Publication 2013/0234110 discloses an m-plane nitride semiconductor light-emitting element. As shown in FIG. 9, the m-plane nitride semiconductor light-emitting element comprises an n-side electrode 909, an n-type nitride semiconductor layer 902, an active layer 905, a p-type nitride semiconductor layer 907 and a p-side electrode 910. A voltage is applied between the n-side electrode 909 and the p-side electrode 910 to emit light from the active layer 905.

A p-type AlGaN electron block layer 906 is interposed between the p-type nitride semiconductor layer 907 and the active layer 905.

The p-type nitride semiconductor layer 907 and the p-type AlGaN electron block layer 906 contain magnesium as a dopant.

SUMMARY

When an m-plane nitride semiconductor light-emitting element is subjected to annealing, magnesium contained in the p-type nitride semiconductor layer 907 and in the p-type AlGaN electron block layer 906 may be diffused into the active layer 905. This diffusion phenomenon of magnesium also occurs when a voltage is applied to the m-plane nitride semiconductor light-emitting element.

Magnesium which has diffused into the active layer 905 reduces luminous efficiency of the active layer 905.

The present invention provides a nitride semiconductor light-emitting element comprising:

an n-side electrode;
a p-side electrode;
an n-type nitride semiconductor layer electrically connected to the n-side electrode;
a p-type nitride semiconductor layer electrically connected to the p-side electrode; and
an active layer interposed between the n-type nitride semiconductor layer and the p-type nitride semiconductor layer;
wherein
the p-type nitride semiconductor layer comprises an $Al_{x1}In_{y1}Ga_{z1}N$ layer ($0<x1\le1$, $0\le y1<1$, $0\le z1<1$, $x1+y1+z1=1$),
an $Al_{x2}In_{y2}Ga_{z2}N$ layer is interposed between the $Al_{x1}In_{y1}Ga_{z1}N$ layer and the active layer ($0<x2\le1$, $0\le y2<1$, $0<z2<1$, $x2+y2+z2=1$),
the n-type nitride semiconductor layer, the active layer, the p-type nitride semiconductor layer, the $Al_{x1}In_{y1}Ga_{z1}N$ layer and the $Al_{x2}In_{y2}Ga_{z2}N$ layer are each formed of a non-polar or semi-polar nitride semiconductor, the $Al_{x1}In_{y1}Ga_{z1}N$ layer has a higher bandgap than the $Al_{x2}In_{y2}Ga_{z2}N$ layer,
the $Al_{x2}In_{y2}Ga_{z2}N$ layer has a first interface and a second interface,
the first interface is located close to or in contact with the active layer,
the second interface is located close to or in contact with the $Al_{x1}In_{y1}Ga_{z1}N$ layer,
the $Al_{x2}In_{y2}Ga_{z2}N$ layer has a thickness t1,
the $Al_{x2}In_{y2}Ga_{z2}N$ layer has a hydrogen concentration distribution along its thickness direction in the inside thereof in such a manner that the hydrogen concentration is increased from the first interface to a thickness t2 (t2<t1), reaches a peak at the thickness t2, and is decreased from the thickness t2 to the second interface.

Magnesium contained in the $Al_{x1}In_{y1}Ga_{z1}N$ layer is prevented from being diffused into the active layer. For this reason, the luminous efficiency is improved.

DETAILED DESCRIPTION OF THE EMBODIMENTS

Embodiments of the present invention will be described below with reference to the drawings.

Figure 1:
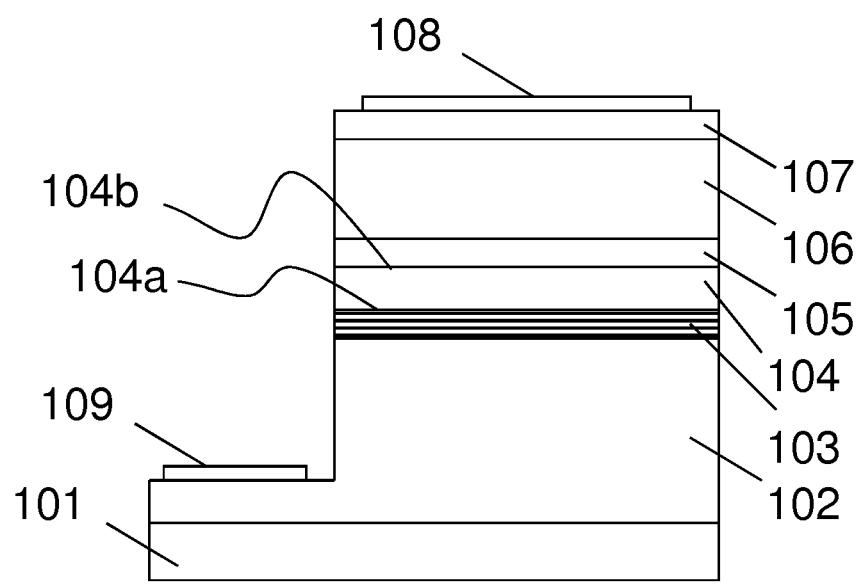
FIG. 1 shows a cross-sectional view of a nitride semiconductor light-emitting element according to the present embodiment.

As shown in FIG. 1, a nitride semiconductor light-emitting element according to the present embodiment comprises an n-side electrode 109, a p-side electrode 108, an n-type nitride semiconductor 102 electrically connected to the n-side electrode 109, a p-type nitride semiconductor 106 electrically connected to the p-side electrode 108, and an active layer 103 interposed between the n-type nitride semiconductor 102 and the p-type nitride semiconductor 106.

The p-type nitride semiconductor layer 106 comprises a p-type $Al_{x1}In_{y1}Ga_{z1}N$ layer 105 ($0<x1\le1$, $0\le y1<1$, $0\le z1<1$, $x1+y1+z1=1$). Desirably, the value of y1 is equal to 0. Desirably, the value of x1 is not less than 0.1 and not more than 0.3.

The $Al_{x1}In_{y1}Ga_{z1}N$ layer 105 functions as an overflow-suppression layer. In more detail, electrons are supplied from the n-side electrode 109 to the active layer 103. When an excess amount of the electrons are supplied to the active layer 103, a portion of the excess amount of the electrons travels through the active layer 103 toward the p-side electrode 108. However, the excess amount of the electrons thus supplied to the active layer 103 are blocked by the $Al_{x1}In_{y1}Ga_{z1}N$ layer 105 to return to the active layer 103. As understood from this description, since the $Al_{x1}In_{y1}Ga_{z1}N$ layer 105 blocks the excess amount of the electrons supplied from the n-side electrode 109 to the active layer 103, the $Al_{x1}In_{y1}Ga_{z1}N$ layer 105 is referred to as an overflow-suppression layer.

The p-type $Al_{x1}In_{y1}Ga_{z1}N$ layer 105 contains magnesium as a dopant.

The n-type nitride semiconductor layer 102, the active layer 103, the p-type nitride semiconductor layer 106 and the $Al_{x1}In_{y1}Ga_{z1}N$ layer 105 are each formed of a non-polar or semi-polar nitride semiconductor. Desirably, these layers are each formed of an m-plane nitride semiconductor.

The $Al_{x2}In_{y2}Ga_{z2}N$ layer 104 ($0<x2\leq1$, $0\leq y2<1$, $0<z2<1$, $x2+y2+z2=1$) is interposed between the $Al_{x1}In_{y1}Ga_{z1}N$ layer 105 and the active layer 103. This $Al_{x2}In_{y2}Ga_{z2}N$ layer 104 is also formed of a non-polar or semi-polar nitride semiconductor. Desirably, the $Al_{x2}In_{y2}Ga_{z2}N$ layer 104 is also formed of an m-plane nitride semiconductor.

The $Al_{x2}In_{y2}Ga_{z2}N$ layer 104 contains aluminum. In other words, the value of x2 is more than zero. The value of x2 must not be zero. In case where the layer 104 does not contains aluminum, the magnesium contained in the p-type $Al_{x1}In_{y1}Ga_{z1}N$ layer 105 is not prevented sufficiently from being diffused into the active layer 103, as described in more detail in the comparative examples 1-4, which are described later. Desirably, the value of y2 is equal to 0. Desirably, the value of x2 is not less than 0.001 and not more than 0.10.

The $Al_{x1}In_{y1}Ga_{z1}N$ layer 105 has a higher bandgap than the $Al_{x2}In_{y2}Ga_{z2}N$ layer 104. In case where the $Al_{x2}In_{y2}Ga_{z2}N$ layer 104 has a higher bandgap than the $Al_{x1}In_{y1}Ga_{z1}N$ layer 105, the $Al_{x1}In_{y1}Ga_{z1}N$ layer 105 does not function as the overflow-suppression layer.

The $Al_{x2}In_{y2}Ga_{z2}N$ layer 104 has a first interface 104a and a second interface 104b. In FIG. 1, the first interface 104a is in contact with the active layer 103. The second interface 104b is in contact with the $Al_{x1}In_{y1}Ga_{z1}N$ layer 105.

A nitride semiconductor layer (not shown) may be interposed between the $Al_{x2}In_{y2}Ga_{z2}N$ layer 104 and the active layer 103. In this case, the first interface 104a is in contact with the nitride semiconductor thus interposed. Similarly, a different nitride semiconductor layer (not shown) may be interposed between the $Al_{x2}In_{y2}Ga_{z2}N$ layer 104 and the $Al_{x1}In_{y1}Ga_{z1}N$ layer 105. In this case, the second interface 104b is in contact with the different nitride semiconductor layer thus interposed. In other words, in this case, the first interface 104a and the second interface 104b are close to the active layer 103 and the $Al_{x1}In_{y1}Ga_{z1}N$ layer 105, respectively.

The $Al_{x2}In_{y2}Ga_{z2}N$ layer 104 has a thickness t1. Desirably, the thickness t1 is not less than 20 nanometers and not more than 100 nanometers. In a case where the thickness t1 is less than 20 nanometers, magnesium contained in the $Al_{x1}In_{y1}Ga_{z1}N$ layer 105 may not be prevented sufficiently from being diffused into the active layer 103. This is because the $Al_{x2}In_{y2}Ga_{z2}N$ layer 104 is too thin. On the other hand, in a case where the thickness t1 is more than 100 nanometers, the luminous efficiency of the nitride semiconductor light-emitting element may be decreased. This is because a thicker $Al_{x2}In_{y2}Ga_{z2}N$ layer 104 has a greater resistance.

More desirably, the thickness t1 is not less than 30 nanometers and not more than 75 nanometers.

Figure 2A:
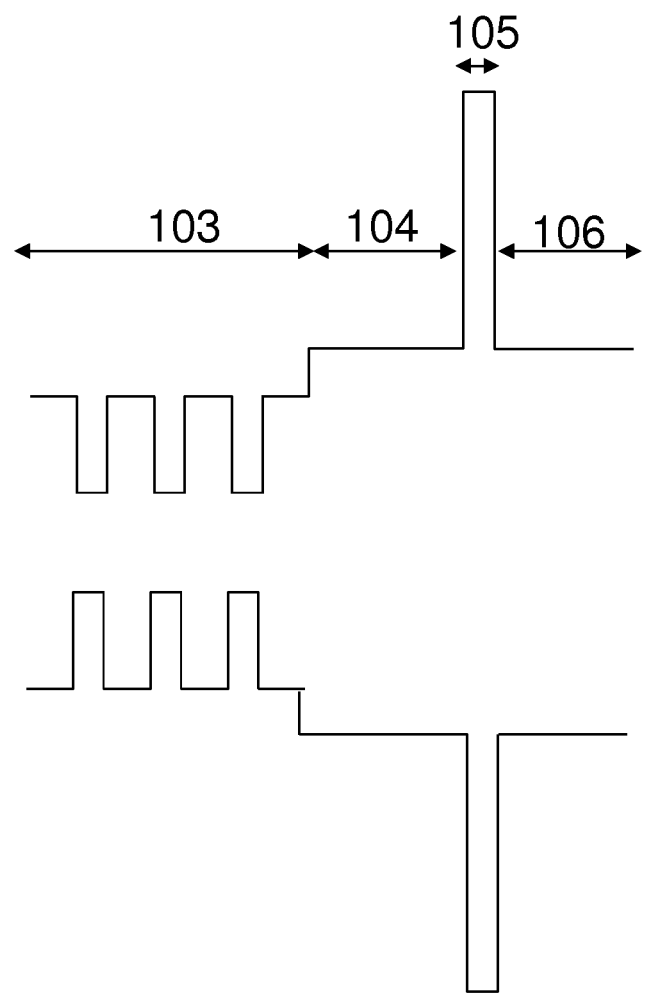
FIG. 2A shows bandgaps of the active layer 103, the $Al_{x2}In_{y2}Ga_{z2}N$ layer 104 and the $Al_{x1}In_{y1}Ga_{z1}N$ layer 105.
Figure 2B:
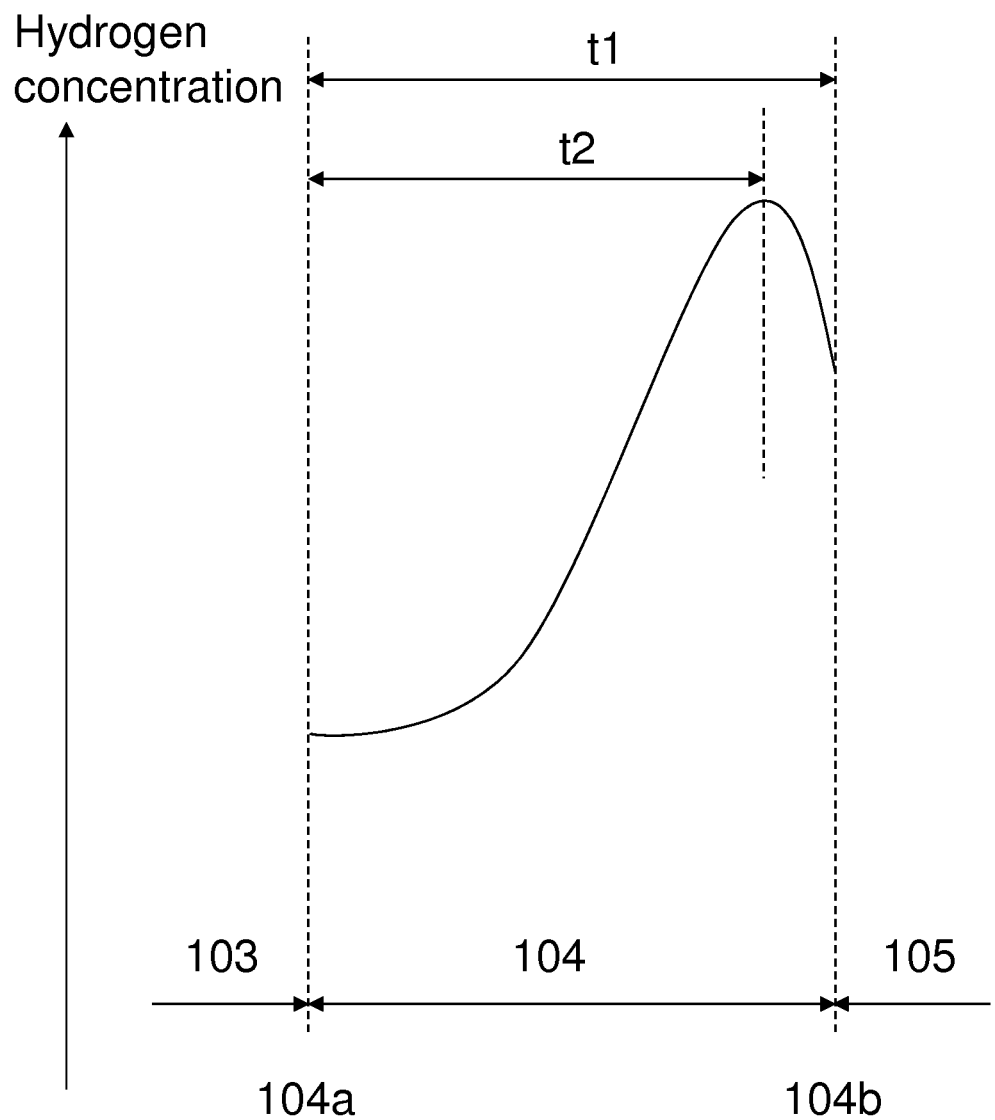
FIG. 2B shows a hydrogen concentration distribution in the $Al_{x2}In_{y2}Ga_{z2}N$ layer 104 along the thickness direction thereof.

FIG. 2A shows a bandgap of the active layer 103, the $Al_{x2}In_{y2}Ga_{z2}N$ layer 104 and the $Al_{x1}In_{y1}Ga_{z1}N$ layer 105. FIG. 2B shows a hydrogen concentration distribution in the $Al_{x2}In_{y2}Ga_{z2}N$ layer 104 along the thickness direction thereof.

As shown in FIG. 2B, the hydrogen concentration is increased from the first interface 104a to a thickness t2 (t2<t1). Desirably, the hydrogen concentration is increased monotonically. The hydrogen concentration reaches a peak at the thickness t2. The hydrogen concentration is decreased from the thickness t2 to the second interface 104b. Desirably, the hydrogen concentration is decreased monotonically.

Magnesium contained in the p-type nitride semiconductor layer is diffused greater in an m-plane nitride semiconductor light-emitting element than in a conventional c-plane nitride semiconductor light-emitting element, as understood from the comparison between the example 1 (FIG. 4A) and the reference example 1 (FIG. 4B), both of which are described later. For this reason, the problem that magnesium decreases the luminous efficiency of the active layer 103 is more serious in an m-plane nitride semiconductor light-emitting element than in a conventional c-plane nitride semiconductor light-emitting element.

Also when a voltage is applied between the p-side electrode 108 and the n-side electrode 109, magnesium contained in the p-type nitride semiconductor layer 106 is diffused into the active layer 103.

As is clear from the examples 1-3, which are described later, the $Al_{x2}In_{y2}Ga_{z2}N$ layer 104 prevents magnesium from being diffused into the active layer 103. For this reason, it is difficult for magnesium to reach the active layer 103. In this way, the luminous efficiency of the active layer 103 is improved.

Figure 5:
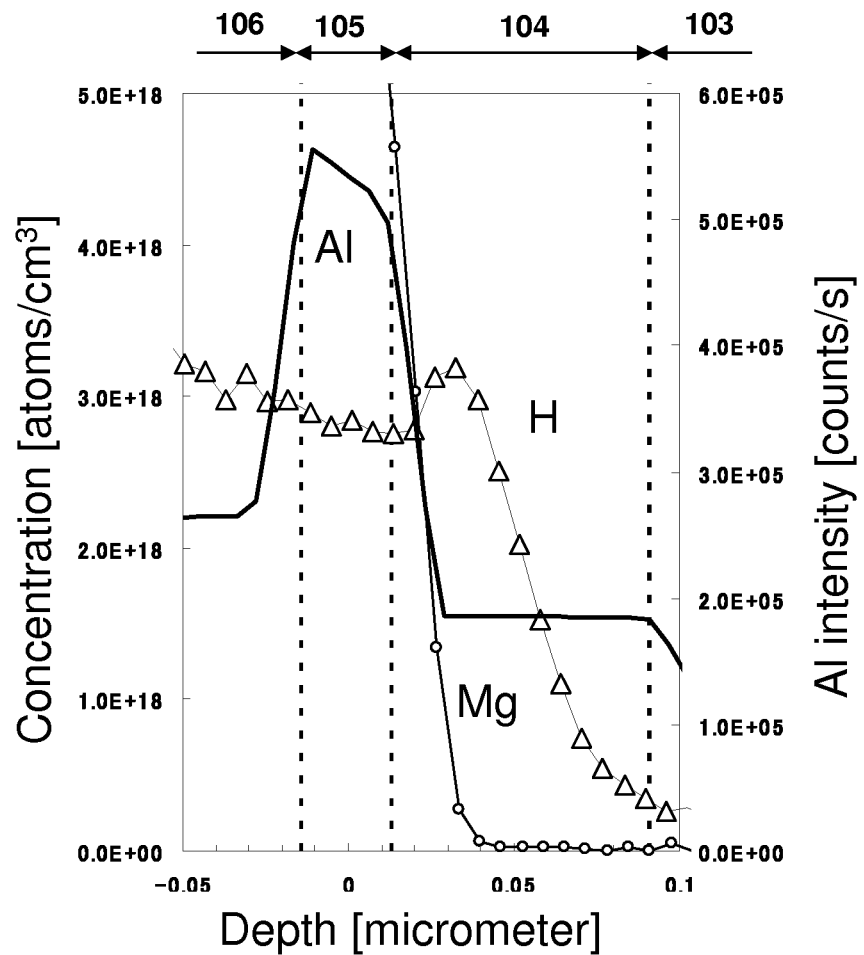
FIG. 5 shows a SIMS analysis result of the nitride semiconductor light-emitting element according to the example 1.

In particular, as shown in FIG. 5, which described later, it is desirable that magnesium is prevented from being diffused in such a manner that the magnesium concentration at the first interface 104a is not more than $1.0 \times 10^{17}$ atoms/cm³.

The reason why the nitride semiconductor light-emitting element according to the present embodiment has the improved luminous efficiency is described in the following items (a) and (b).

(a) The $Al_{x2}In_{y2}Ga_{z2}N$ layer 104 contains aluminum.
(b) The $Al_{x2}In_{y2}Ga_{z2}N$ layer 104 has a peak of the hydrogen concentration at the thickness t2.

First, the item (a) is described in more detail.

As explained in C. Stampfl et. al., "Doping of $Al_xGa_{1-x}N$ alloys", Material science and Engineering B59, 253-257 (1999), magnesium contained in an AlGaN layer is more unstable than magnesium contained in a GaN layer. For this reason, compared to a case where the layer 104 is a nitride semiconductor layer which does not contain aluminum, magnesium is poorly diffused from the $Al_{x1}In_{y1}Ga_{z1}N$ layer 105 to the $Al_{x2}In_{y2}Ga_{z2}N$ layer 104, which contains aluminum.

Next, the item (b) is described. As described in R. R. Wixom et. al. "Binding of the N interstitial with neutral MgH in p-type GaN investigated with density functional theory", PHYSICAL REVIEW B 72, 024114 (2005), an Mg—H bond is stable in a nitride semiconductor. For this reason, even when magnesium is diffused into the $Al_{x2}In_{y2}Ga_{z2}N$ layer 104, magnesium is bound to hydrogen contained in the $Al_{x2}In_{y2}Ga_{z2}N$ layer 104.

The hydrogen concentration is increased in the section from the second interface 104b to the thickness t2, namely, the peak position of the hydrogen concentration. See FIG. 2B. For this reason, it would be significantly difficult for magnesium to be diffused into the active layer 103 in the section from the second interface 104b to the thickness t2, namely, the peak position of the hydrogen concentration. This is because a stable Mg—H bond is formed in this section. In other words, the hydrogen concentration distribution where the hydrogen concentration reaches the peak at the thickness t2 prevents magnesium from being diffused into the active layer 103. In this way, the $Al_{x2}In_{y2}Ga_{z2}N$ layer 104 having the hydrogen concentration distribution where the hydrogen concentration reaches the peak at the thickness t2 functions as a layer which captures magnesium.

In case where the hydrogen concentration in the $Al_{x2}In_{y2}Ga_{z2}N$ layer 104 decreases monotonically from the second interface 104b to the first interface 104a in such a manner that the hydrogen concentration in the $Al_{x2}In_{y2}Ga_{z2}N$ layer 104 has no peak, magnesium diffused into the $Al_{x2}In_{y2}Ga_{z2}N$ layer 104 reaches the active layer 103 easily. For this reason, the luminous efficiency is not improved. See the comparative example 1 (FIG. 6) and the comparative example 5 (FIG. 7). Accordingly, the $Al_{x2}In_{y2}Ga_{z2}N$ layer 104 is required to have a hydrogen concentration distribution where the hydrogen concentration reaches a peak at the thickness t2.

On the other hand, hydrogen contained in the $Al_{x2}In_{y2}Ga_{z2}N$ layer 104 may be diffused by annealing or application of a voltage. Hydrogen reduces the luminous efficiency of the active layer 103. For this reason, it is desirable that the thickness t2 is not less than 10 nanometers. More desirably, the thickness t2 is not less than 15 nanometers. Still more desirably, the thickness t2 is not less than 20 nanometers. It is desirable that the thickness t2 is not more than 80 nanometers. As described above, the thicker $Al_{x2}In_{y2}Ga_{z2}N$ layer 104 has a greater resistance.

Desirably, the lower limit of the hydrogen concentration at the thickness t2 (i.e., at the peak) is $1.0 \times 10^{17}$ atoms/cm$^3$. In a case where the hydrogen concentration at the thickness t2 (i.e., at the peak) is less than this value, the luminous efficiency decreases. This because an Mg—H bond is not formed sufficiently in the inside of the $Al_{x2}In_{y2}Ga_{z2}N$ layer 104, since the hydrogen concentration is too low.

Desirably, the upper limit of the hydrogen concentration at the thickness t2 (i.e., at the peak) is $1.0 \times 10^{19}$ atoms/cm$^3$. In a case where the hydrogen concentration at the thickness t2 (i.e., at the peak) is more than this value, there are a great amount of hydrogen atoms near the active layer 103. These great amount of hydrogen atoms are diffused into the active layer 103 by annealing to decrease the luminous efficiently.

(Fabrication Method)

Then, a method for fabricating a nitride semiconductor light-emitting element according to the present embodiment is described.

First, a substrate 101 is prepared. Desirably, the substrate 101 is a single-crystalline substrate formed of an m-plane GaN.

Figure 8:
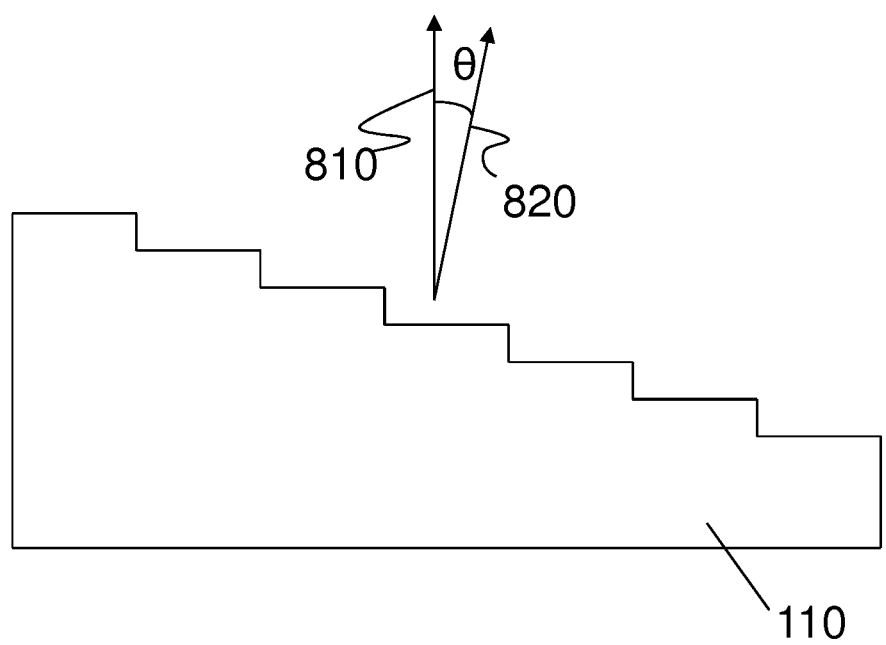
FIG. 8 shows a substrate 101 having an off-angle θ.
Figure 9:
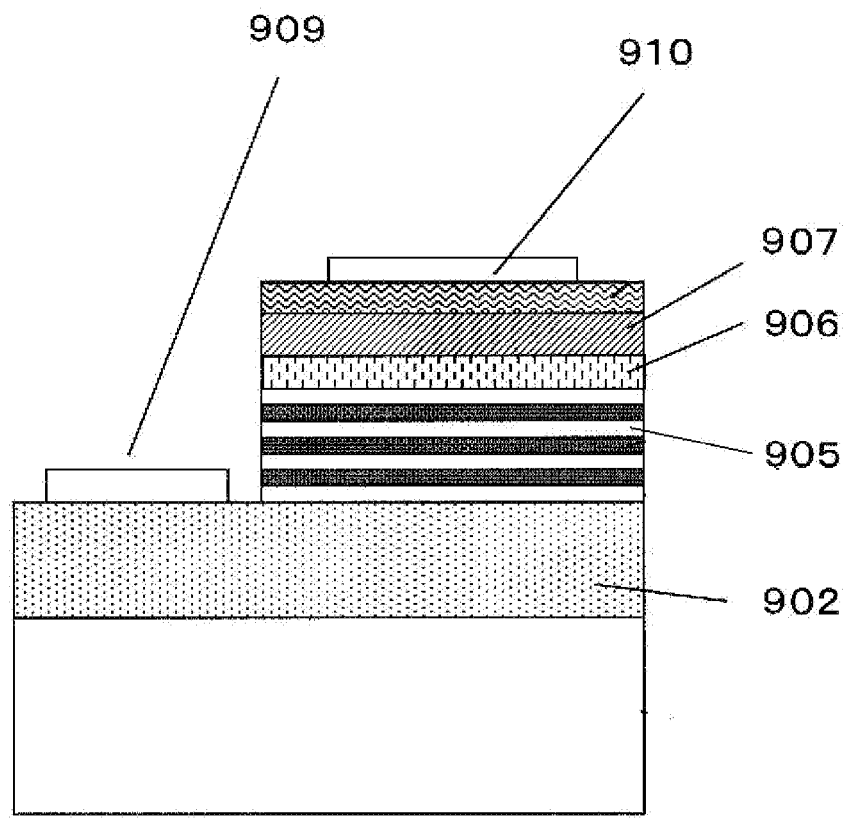
FIG. 9 shows an m-plane nitride semiconductor light-emitting element disclosed in International Publication No. 2012/140844.

As shown in FIG. 8, the substrate 101 may have an off-angle θ. The off-angle θ is formed between the normal direction 810 of the m-plane and the normal direction 820 of the principal plane. The off-angle θ may be more than 0 degrees and not more than 5 degrees. When the substrate 101 has an off-angle θ, the surface of the substrate 101 is stepwise microscopically. Desirably, the off-angle θ is equal to zero degrees. In other words, it is desirable that the substrate 101 does not have the off-angle θ.

Then, the n-type nitride semiconductor layer 102 is epitaxially grown on the substrate 101. Furthermore, the active layer 103 is epitaxially grown on the n-type nitride semiconductor layer 102.

The $Al_{x2}In_{y2}Ga_{z2}N$ layer 104 is epitaxially grown on the active layer 103. The following procedures P1 and P2 are examples of the procedure where the $Al_{x2}In_{y2}Ga_{z2}N$ layer 104 is epitaxially grown to have the peak of the hydrogen concentration at the thickness t2.

(Procedure P1)

Figure 3:
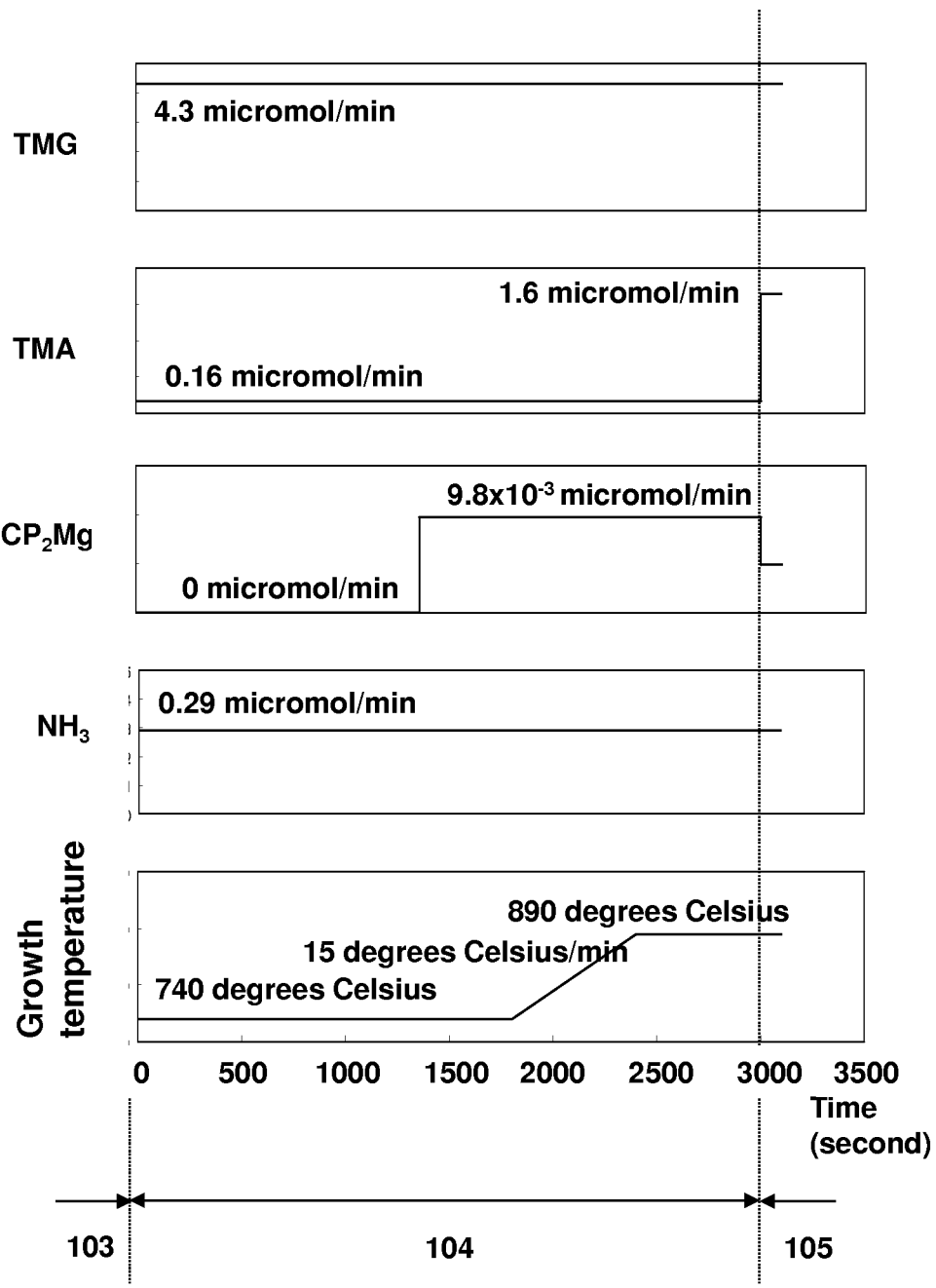
FIG. 3 shows an example of an epitaxial growth profile according to the procedure P1.

FIG. 3 shows an example of the epitaxial growth profile according to the procedure P1.

First, trimethyl gallium (in FIG. 3, referred to as "TMG"), trimethyl aluminum (in FIG. 3, referred to as "TMA") and ammonia are supplied in the procedure P1 to form a lower part of the $Al_{x2}In_{y2}Ga_{z2}N$ layer 104. Trimethyl indium may also be supplied.

Subsequently, bis(cyclopentadienyl) magnesium (in FIG. 3, referred to as "CP$_2$Mg") is also supplied to form an upper part of the $Al_{x2}In_{y2}Ga_{z2}N$ layer 104 on the lower part of the $Al_{x2}In_{y2}Ga_{z2}N$ layer 104.

While the upper part of the $Al_{x2}In_{y2}Ga_{z2}N$ layer 104 is epitaxially grown, a growth temperature is gradually raised. In particular, the lower part of the $Al_{x2}In_{y2}Ga_{z2}N$ layer 104 is epitaxially grown under a growth temperature of 700-760 degrees Celsius.

The upper part of the $Al_{x2}In_{y2}Ga_{z2}N$ layer 104 is also epitaxially grown under a growth temperature of 700-760 degrees Celsius in the beginning. During this time, hydrogen atoms generated due to the thermal decomposition of bis (cyclopentadienyl) magnesium are incorporated into the growing $Al_{x2}In_{y2}Ga_{z2}N$ layer 104.

Subsequently, the growth temperature is gradually raised to 850-900 degrees Celsius. Desirably, the temperature rise rate falls within the range of 10-20 degrees Celsius/minute.

The higher the growth temperature is, the more molecular motion is activated. For this reason, the hydrogen atoms tend to be incorporated poorly into the $Al_{x2}In_{y2}Ga_{z2}N$ layer 104.

As described above, while bis(cyclopentadienyl) magnesium is supplied under a low growth temperature of 700-760 degrees Celsius, hydrogen atoms are easily incorporated into the growing $Al_{x2}In_{y2}Ga_{z2}N$ layer 104. On the other hand, while bis(cyclopentadienyl) magnesium is supplied under a high growth temperature of 850-900 degrees Celsius, hydrogen atoms are poorly incorporated into the growing $Al_{x2}In_{y2}Ga_{z2}N$ layer 104. For this reason, as shown in FIG. 2B, the peak of the hydrogen concentration is generated in the $Al_{x2}In_{y2}Ga_{z2}N$ layer 104. In this way, provided is the hydrogen concentration distribution where the hydrogen concentration reaches the peak at the thickness t2. For more detail, see the examples.

(Procedure P2)

In the procedure P2, hydrogen is mixed with a carrier gas used when the $Al_{x2}In_{y2}Ga_{z2}N$ layer 104 is epitaxially grown. An example of the carrier gas generally used is a nitrogen gas. In other words, a mixture gas of nitrogen and hydrogen is used as the carrier gas when the $Al_{x2}In_{y2}Ga_{z2}N$ layer 104 is epitaxially grown. The ratio of hydrogen mixed with the carrier gas to nitrogen is adjusted during the epitaxial growth of the $Al_{x2}In_{y2}Ga_{z2}N$ layer 104, and the hydrogen concentration distribution where the hydrogen concentration reaches the peak at the thickness t2 is obtained.

After the $Al_{x2}In_{y2}Ga_{z2}N$ layer 104 is epitaxially grown, the p-type $Al_{x1}In_{y1}Ga_{z1}N$ layer 105 is epitaxially grown. Furthermore, the p-type AlGaN layer 106 and a p-type GaN contact layer 107 are epitaxially grown. In this way, a nitride semiconductor stacking structure is obtained.

Subsequently, the nitride semiconductor stacking structure is subjected to a heat-treatment to activate the n-type dopant and the p-type dopant. A portion of the nitride semiconductor stacking structure is removed as shown in FIG. 1, and the n-side electrode 109 and the p-side electrode 108 are formed. In this way, a nitride semiconductor light-emitting element is obtained.

EXAMPLES

The present invention is described in greater detail below with reference to the following examples.

In the following examples and comparative examples, a metalorganic chemical vapor deposition method (hereinafter, referred to as "MOCVD method") was used as an epitaxial growth method.

In the following examples and comparative examples, raw materials shown in the following Table 1 were used.

TABLE 1

| Al raw materials | Trimethyl aluminum (TMA) |
|---|---|
| In raw materials | Trimethyl indium (TMI) |
| Ga raw materials | Trimethyl gallium (TMG) |
| Nitrogen raw materials | Ammonia |
| n-type impurities | Monosilane |
| p-type impurities | Bis(cyclopentadienyl) magnesium ($CP_2Mg$) |

Example 1

The example 1 is described with reference to FIG. 1. First, the n-type GaN substrate 101 having a principal plane of an m-plane was prepared.

Then, the n-type GaN layer 102 having a thickness of 2 micrometers was epitaxially grown on the n-type GaN substrate 101 at a growth temperature of 1,040 degrees Celsius. The n-type GaN layer 102 had a silicon concentration of $2.0 \times 10^{18}$ cm$^{-3}$.

The multi-quantum-well layer 103, namely, an active layer 103, was epitaxially grown on the n-type GaN layer 102 at a growth temperature of 720 degrees Celsius. In greater detail, the multi-quantum-well layer 103 was formed by stacking three $In_xGa_{1-x}N$ layers (x=0.15) each having a thickness of 6 nanometers and four GaN layers each having a thickness of 12 nanometers alternately.

Subsequently, according to the epitaxial growth profile shown in FIG. 3, the $Al_{x2}In_{y2}Ga_{z2}N$ layer 104 (x=0.01, y=0.008, z=0.982) was epitaxially grown on the active layer 103. The $Al_{x2}In_{y2}Ga_{z2}N$ layer 104 had a thickness of 75 nanometers. In other words, the thickness t1 was equal to 75 nanometers in the example 1.

The epitaxial growth of the $Al_{x2}In_{y2}Ga_{z2}N$ layer 104 is described below in more detail.

First, trimethyl gallium, trimethyl aluminum and ammonia were started to be supplied onto the active layer 103 at flow rates of 4.3 micromol/minute, 0.16 micromol/minute, and 0.29 micromol/minute, respectively. The growth temperature was 740 degrees Celsius.

After 1,400 seconds had elapsed from the start of the supply of the raw material gas, bis(cyclopentadienyl) magnesium started to be supplied at a flow rate of $9.8 \times 10^{-3}$ micromol/minute.

After 1,800 seconds had elapsed from the start of the supply of the raw material gas, the growth temperature was raised at a rate of 15 degrees Celsius/minute. After 2,400 seconds had elapsed from the start of the supply of the raw material gas, the growth temperature reached 890 degrees Celsius. After that, the growth temperature was maintained at 890 degrees Celsius. After 3,000 seconds had elapsed from the start of the supply of the raw material gas the growth of the $Al_{x2}In_{y2}Ga_{z2}N$ layer 104 was completed.

The p-type $Al_{x1}In_{y1}Ga_{z1}N$ layer 105 (x=0.20, y=0, z=0.80) was epitaxially grown on the $Al_{x2}In_{y2}Ga_{z2}N$ layer 104 at a growth temperature of 720 degrees Celsius. The $Al_{x1}In_{y1}Ga_{z1}N$ layer 105 had a thickness of 20 nanometers. The $Al_{x1}In_{y1}Ga_{z1}N$ layer 105 had a magnesium concentration of approximately $5.0 \times 10^{18}$ cm$^{-3}$–$1.0 \times 10^{19}$ cm$^{-3}$.

The p-type $Al_{0.02}Ga_{0.98}N$ layer 106 was epitaxially grown on the p-type $Al_{x1}In_{y1}Ga_{z1}N$ layer 105 at a growth temperature of 890 degrees Celsius. The p-type $Al_{0.02}Ga_{0.98}N$ layer 106 had a thickness of 100 nanometers. The p-type $Al_{0.02}Ga_{0.98}N$ layer 106 had a magnesium concentration of $1.5 \times 10^{19}$ cm$^{-3}$.

The p-type GaN contact layer 107 was epitaxially grown on the p-type $Al_{0.02}Ga_{0.98}N$ layer 106 at a growth temperature of 890 degrees Celsius. The p-type GaN contact layer 107 had a thickness of 50 nanometers. The p-type GaN contact layer 107 had a magnesium concentration of $1.0 \times 10^{20}$ cm$^{-3}$. In this way, the nitride semiconductor stacking structure was obtained.

The nitride semiconductor stacking structure was subjected to annealing under a nitride atmosphere at a temperature of 850 degrees Celsius for 60 minutes to activate the p-type dopant, namely, magnesium.

Finally, the p-side electrode 108 and the n-side electrode 109 were formed. In this way, a nitride semiconductor light-emitting element according to the example 1 was obtained.

Then, the nitride semiconductor light-emitting element according to the example 1 was subjected to a SIMS analysis. FIG. 5 shows the SIMS analysis of the nitride semiconductor light-emitting element according to the example 1.

As is clear from FIG. 5, the $Al_{x2}In_{y2}Ga_{z2}N$ layer 104 had a peak of the hydrogen concentration in the inside thereof. The thickness t2 was estimated to be approximately 58 nanometers from FIG. 5.

Then, the light-emitting intensity of the nitride semiconductor light-emitting element according to the example 1 was measured with an Si photodiode (product of Hamamatsu Photonics, product number: PD S2281-01). Table 2 shows the results.

Example 2

An experiment similar to the example 1 was performed except that the $Al_{x2}In_{y2}Ga_{z2}N$ layer 104 had a thickness of 50 nanometers.

Example 3

An experiment similar to the example 1 was performed except that the $Al_{x2}In_{y2}Ga_{z2}N$ layer 104 had a thickness of 30 nanometers.

Comparative Example 1

Figure 4A:
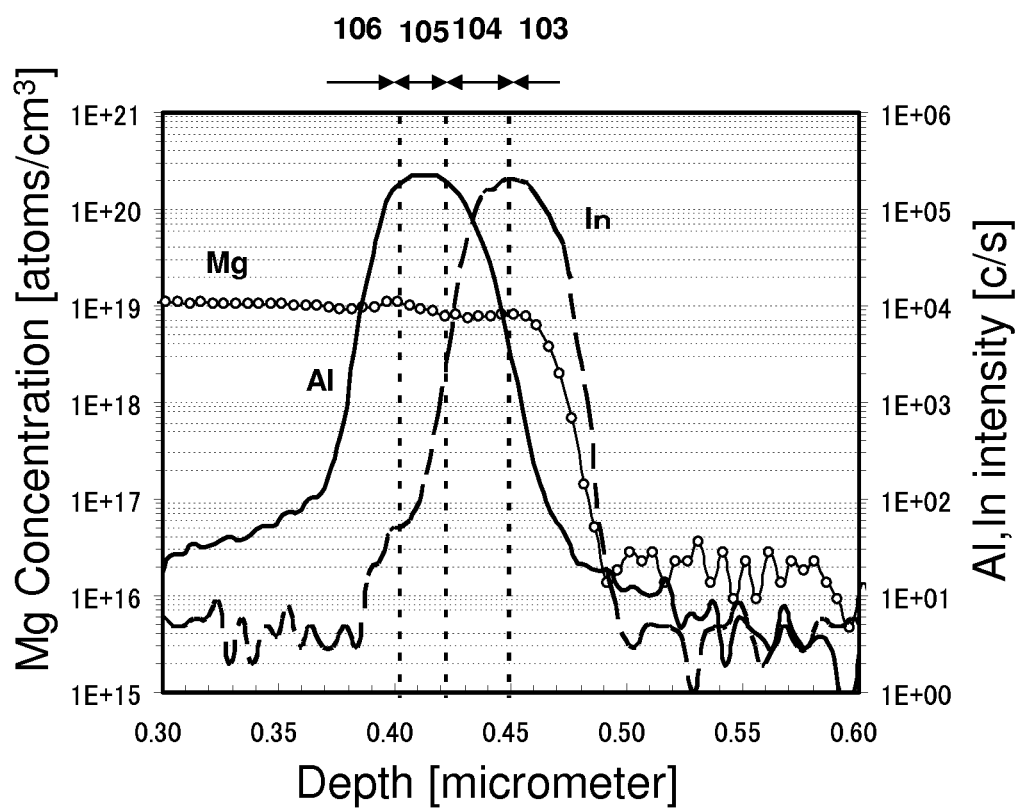
FIG. 4A shows a SIMS analysis result of the nitride semiconductor light-emitting element according to the comparative example 1.

An experiment similar to the example 1 was performed except that a GaN layer 104 was epitaxially grown instead of the $Al_{x2}In_{y2}Ga_{z2}N$ layer 104 (x=0.01, y=0.008, z=0.982). FIG. 4A shows the SIMS analysis result of the nitride semiconductor light-emitting element according to the comparative example 1.

Figure 6:
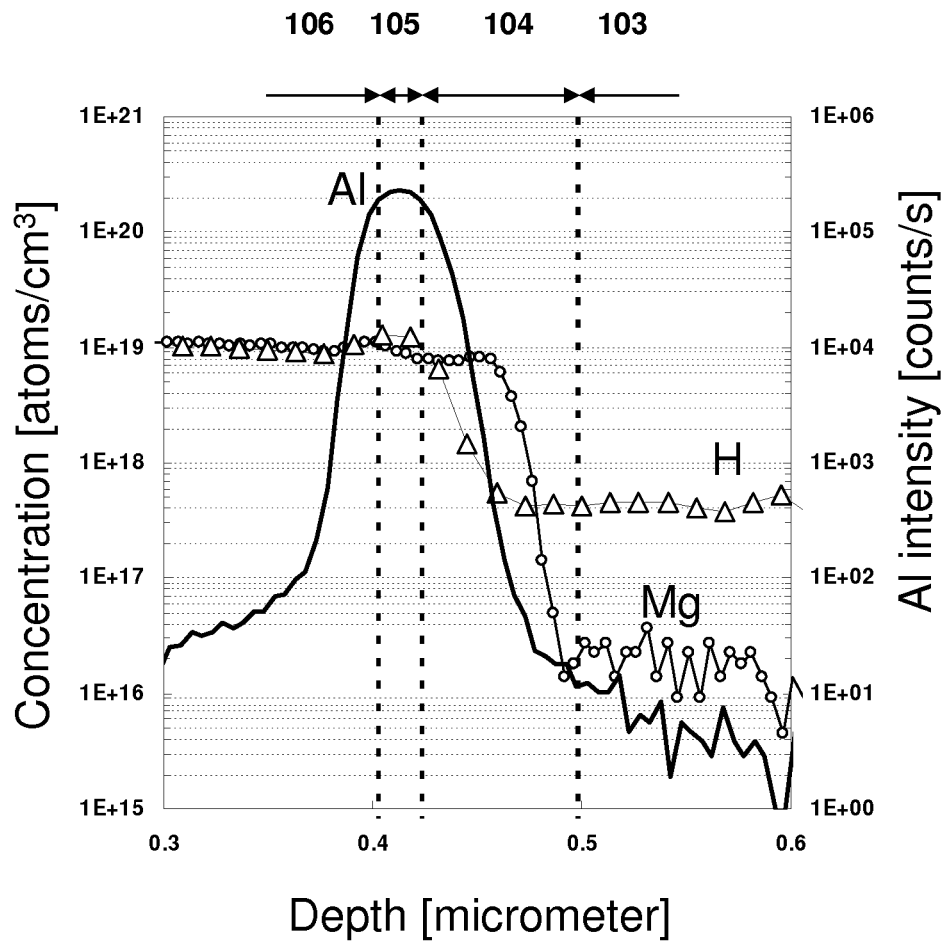
FIG. 6 shows a SIMS analysis result in the comparative example 1 before the p-type dopant, namely, magnesium, was activated by annealing.
Figure 7:
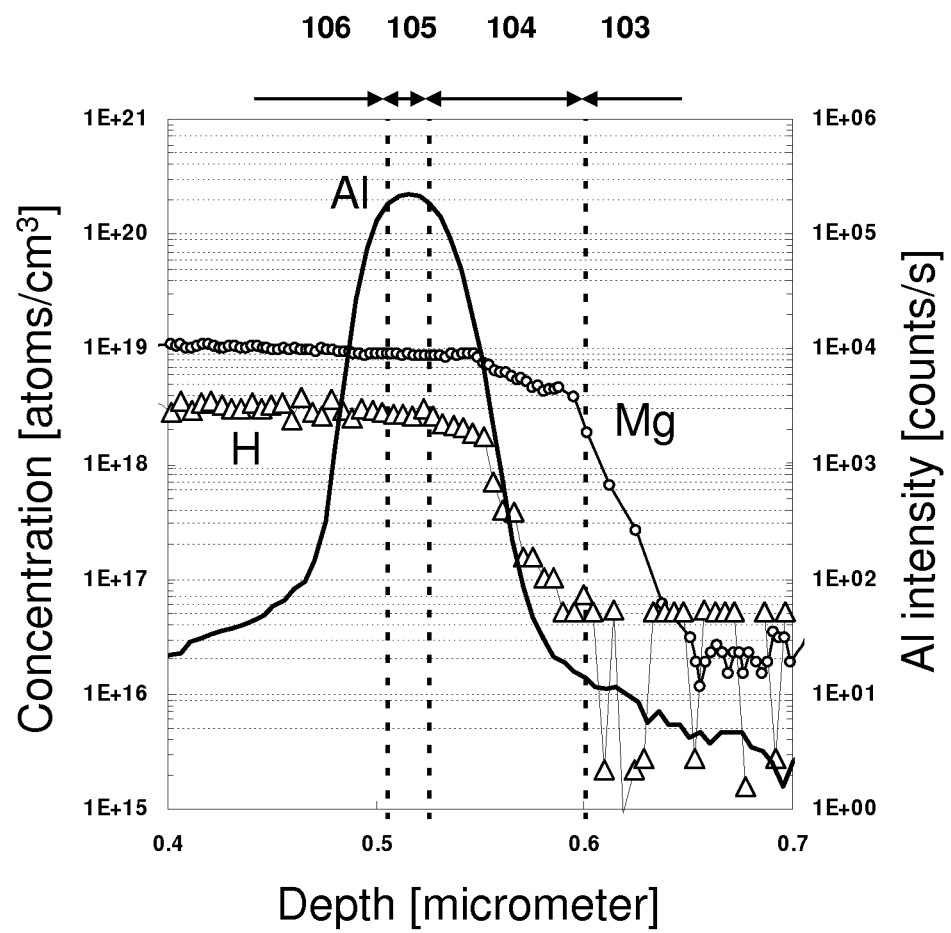
FIG. 7 shows a SIMS analysis result in the comparative example 5 after the p-type dopant was activated by annealing.

FIG. 6 shows a SIMS analysis result in the comparative example 1 before the p-type dopant, namely, magnesium, was activated by annealing. As is clear from FIG. 6, magnesium had been diffused into the GaN layer 104 before the p-type dopant was activated by the annealing. It would be obvious that magnesium was diffused into the active layer 103 after the p-type dopant had been activated by the annealing.

Comparative Example 2

An experiment similar to the example 1 was performed except that a GaN layer 104 was epitaxially grown instead of the $Al_{x2}In_{y2}Ga_{z2}N$ layer 104 (x=0.01, y=0.008, z=0.982), and except that the GaN layer 104 had a thickness of 30 nanometers.

Comparative Example 3

An experiment similar to the example 1 was performed except that a GaN layer 104 was epitaxially grown instead of the $Al_{x2}In_{y2}Ga_{z2}N$ layer 104 (x=0.01, y=0.008, z=0.982), and except that the GaN layer 104 had a thickness of 100 nanometers.

Comparative Example 4

An experiment similar to the example 1 was performed except that a GaN layer 104 was epitaxially grown instead of the $Al_{x2}In_{y2}Ga_{z2}N$ layer 104 (x=0.01, y=0.008, z=0.982), and except that the GaN layer 104 had a thickness of 125 nanometers.

Comparative Example 5

An experiment similar to the example 1 was performed except that an $In_{0.008}Ga_{0.992}N$ layer 104 was epitaxially grown instead of the $Al_{x2}In_{y2}Ga_{z2}N$ layer 104 (x=0.01, y=0.008, z=0.982)

FIG. 7 shows a SIMS analysis result in the comparative example 5 after the p-type dopant was activated by annealing. As is clear from FIG. 7, magnesium was diffused into the $In_{0.008}Ga_{0.992}N$ layer 104.

The following Table 2 shows the results of the measurement of the examples and the comparative examples.

TABLE 2

| | x2 | y2 | z2 | Thickness of the layer 104 | Optical power (microampere) |
|---|---|---|---|---|---|
| Example 1 | 0.01 | 0.008 | 0.982 | 75 | 178.4748 |
| Example 2 | 0.01 | 0.008 | 0.982 | 50 | 185.6433 |
| Example 3 | 0.01 | 0.008 | 0.982 | 30 | 181.2818 |
| Comparative example 1 | 0 | 0 | 1 | 75 | 144.1216 |
| Comparative example 2 | 0 | 0 | 1 | 30 | 134.4242 |
| Comparative example 3 | 0 | 0 | 1 | 100 | 124.353 |
| Comparative example 4 | 0 | 0 | 1 | 125 | 112.7791 |
| Comparative example 5 | 0 | 0.008 | 0.992 | 75 | 110.0100 |

As is clear from Table 2, when the $Al_{x2}In_{y2}Ga_{z2}N$ layer 104 (0<x2≤1, 0≤y2<1, 0<z2<1, x2+y2+z2=1) having a peak of the hydrogen concentration in the inside thereof is used, the optical power improves. This means that the luminous efficiency is improved.

Reference Example 1

Figure 4B:
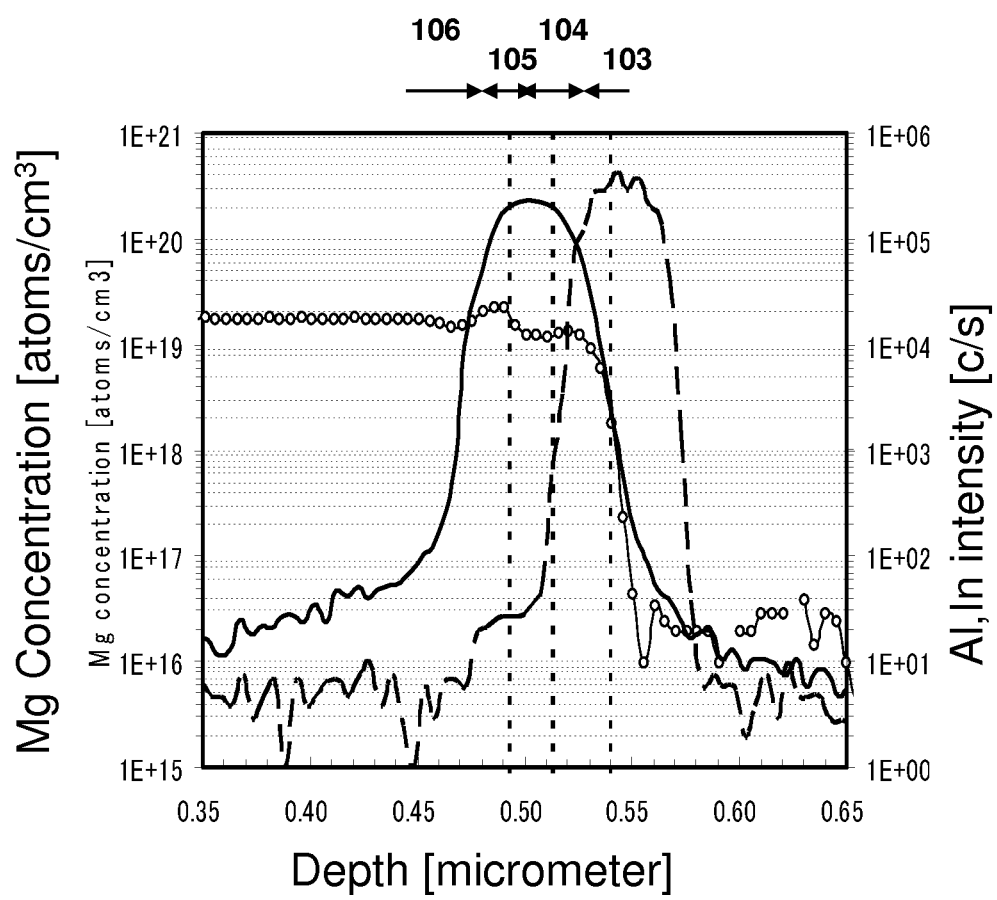
FIG. 4B shows a SIMS analysis result of the nitride semiconductor light-emitting element according to the reference example 1.

An experiment similar to the example 1 was performed except that an n-type GaN substrate 101 having a principal plane of a c-plane was used instead of the n-type GaN substrate 101 having a principal plane of an m-plane. FIG. 4B shows a SIMS analysis result of the nitride semiconductor light-emitting element according to the reference example 1.

As is clear from FIG. 4A and FIG. 4B, compared to a conventional c-plane nitride semiconductor light-emitting element, a larger amount of magnesium contained in the p-type nitride semiconductor layer was diffused into the active layer 103 in the m-plane nitride semiconductor light-emitting element.

INDUSTRIAL APPLICABILITY

The nitride semiconductor light-emitting element according to the present invention is a nitride semiconductor light-emitting diode or a nitride semiconductor laser. A nitride semiconductor light-emitting diode is desirable. The nitride semiconductor light-emitting diode according to the present invention is installed in a lighting installation. Desirably, the nitride semiconductor light-emitting element according to the present invention is installed in an automotive headlight.

REFERENCE SIGNS LIST 101 substrate
102 n-type nitride semiconductor layer
103 active layer
104 $Al_{x2}In_{y2}Ga_{z2}N$ layer
104a first interface
104b second interface
105 $Al_{x1}In_{y1}Ga_{z1}N$ layer
106 p-type nitride semiconductor layer
107 p-type GaN contact layer
108 p-side electrode
109 n-side electrode
t1 thickness
t2 thickness
902 n-type nitride semiconductor layer
905 active layer
906 p-type AlGaN electron block layer
907 p-type nitride semiconductor layer
909 n-side electrode
910 p-side electrode

The invention claimed is:
1. A nitride semiconductor light-emitting element comprising:
an n-side electrode;
a p-side electrode;
an n-type nitride semiconductor layer electrically connected to the n-side electrode;
a p-type nitride semiconductor layer electrically connected to the p-side electrode; and
an active layer interposed between the n-type nitride semiconductor layer and the p-type nitride semiconductor layer; wherein
the p-type nitride semiconductor layer comprises an $Al_{x1}In_{y1}Ga_{z1}N$ layer (0<x1≤1, 0≤y1<1, 0≤z1<1, x1+y1+z1=1),
an $Al_{x2}In_{y2}Ga_{z2}N$ layer is interposed between the $Al_{x1}In_{y1}Ga_{z1}N$ layer and the active layer (0<x2≤1, 0≤y2<1, 0<z2<1, x2+y2+z2=1),
the n-type nitride semiconductor layer, the active layer, the p-type nitride semiconductor layer, the $Al_{x1}In_{y1}Ga_{z1}N$ layer and the $Al_{x2}In_{y2}Ga_{z2}N$ layer are each formed of a non-polar or semi-polar nitride semiconductor,
the $Al_{x1}In_{y1}Ga_{z1}N$ layer has a higher bandgap than the $Al_{x2}In_{y2}Ga_{z2}N$ layer, the $Al_{x2}In_{y2}Ga_{z2}N$ layer has a first interface and a second interface, the first interface is located close to or in contact with the active layer, the second interface is located close to or in contact with the $Al_{x1}In_{y1}Ga_{z1}N$ layer, the $Al_{x2}In_{y2}Ga_{z2}N$ layer has a thickness t1, the $Al_{x2}In_{y2}Ga_{z2}N$ layer has a hydrogen concentration distribution along its thickness direction in the inside thereof in such a manner that the hydrogen concentration is increased from the first interface to a thickness t2 (t2<t1), reaches a peak at the thickness t2, and is decreased from the thickness t2 to the second interface.

2. The nitride semiconductor light-emitting element according to claim 1, wherein the n-type nitride semiconductor layer, the active layer, the p-type nitride semiconductor layer, the $Al_{x1}In_{y1}Ga_{z1}N$ layer and the $Al_{x2}In_{y2}Ga_{z2}N$ layer are each formed of an m-plane nitride semiconductor.

3. The nitride semiconductor light-emitting element according to claim 1, wherein the first interface is in contact with the active layer.

4. The nitride semiconductor light-emitting element according to claim 1, wherein the second interface is in contact with the $Al_{x1}In_{y1}Ga_{z1}N$ layer.

5. The nitride semiconductor light-emitting element according to claim 1, wherein the thickness t1 is not less than 20 nanometers and not more than 100 nanometers.

6. The nitride semiconductor light-emitting element according to claim 1, wherein the thickness t1 is not less than 30 nanometers and not more than 75 nanometers.

7. The nitride semiconductor light-emitting element according to claim 1, wherein a magnesium concentration at the first interface is not more than $1 \times 10^{17}$ atoms/cm$^3$.

8. The nitride semiconductor light-emitting element according to claim 1, wherein the nitride semiconductor light-emitting element is a nitride semiconductor light-emitting diode.

* * * * *